(12) United States Patent
Liu et al.

(10) Patent No.: US 6,828,187 B1
(45) Date of Patent: Dec. 7, 2004

(54) METHOD FOR UNIFORM REACTIVE ION ETCHING OF DUAL PRE-DOPED POLYSILICON REGIONS

(75) Inventors: Joyce C. Liu, Carmel, NY (US); Len Y. Tsou, New City, NY (US); Qingyun Yang, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/707,709

(22) Filed: Jan. 6, 2004

(51) Int. Cl.[7] ............................................. H01L 21/8238
(52) U.S. Cl. ..................... 438/232; 438/231; 438/223; 438/224; 438/305; 438/306
(58) Field of Search ................................. 438/231–232, 438/223–224, 305–306

(56) References Cited

U.S. PATENT DOCUMENTS

| | | | |
|---|---|---|---|
| 5,912,187 A | 6/1999 | Blasko et al. | 438/719 |
| 6,322,714 B1 | 11/2001 | Nallan et al. | 216/67 |
| 6,352,934 B1 | 3/2002 | Lee | 438/704 |
| 6,399,432 B1 | 6/2002 | Zheng et al. | 438/232 |
| 6,451,642 B1 * | 9/2002 | Mehrad et al. | 438/201 |
| 6,458,646 B1 | 10/2002 | Divakaruni et al. | 438/241 |
| 2003/0186492 A1 | 10/2003 | Brown et al. | 438/200 |

* cited by examiner

*Primary Examiner*—Luan Thai
(74) *Attorney, Agent, or Firm*—James J. Cioffi; Cantor Colburn LLP

(57) ABSTRACT

A method for forming a semiconductor device, includes forming a first locally doped semiconductor region of a first conductivity type and a second locally doped semiconductor region of a second conductivity type over an undoped, lower semiconductor region. A first etch is implemented to simultaneously create a desired pattern in the first and second locally doped semiconductor regions in a manner that also provides a first passivation of exposed sidewalls thereof, wherein the first etch removes material from the first and second locally doped regions at a substantially constant rate with respect to one another, and in a substantially anisotropic manner. A second etch is implemented to complete the desired pattern in the undoped, lower semiconductor region in a manner that protects the first and second locally doped regions from additional material removal therefrom.

20 Claims, 5 Drawing Sheets

US 6,828,187 B1

METHOD FOR UNIFORM REACTIVE ION ETCHING OF DUAL PRE-DOPED POLYSILICON REGIONS

BACKGROUND OF INVENTION

The present invention relates generally to semiconductor device processing and, more particularly, to a method for forming a semiconductor device by uniformly etching dual, pre-doped polysilicon regions of the device.

The electronics industry continues to rely upon advances in semiconductor technology to realize higher-functioning devices in more compact areas. For many applications, realizing higher-functioning devices requires integrating a large number of electronic devices into a single silicon wafer. As the number of electronic devices per given area of the silicon wafer increases, the manufacturing process becomes more difficult.

A large variety of semiconductor devices has been manufactured having various applications in numerous disciplines. Such silicon-based semiconductor devices often include metal-oxide-semiconductor (MOS) transistors, such as P-channel MOS (PMOS), N-channel MOS (NMOS) and complementary MOS (CMOS) transistors, bipolar transistors, BiCMOS transistors, etc. Each of these semiconductor devices generally includes a semiconductor substrate on which a number of active devices are formed. The particular structure of a given active device can vary between device types. For example, in a MOS transistor, an active device generally includes a source and drain region, as well as a gate electrode for modulating current between the source and drain regions.

One important aspect of the formation of such devices, or portions thereof, relates to various photolithography and etching processes. In photolithography, a wafer substrate is coated with a light-sensitive material known as photoresist. Next, the wafer is exposed to light, wherein the light striking the wafer is passed through a mask plate. This mask plate defines the desired features to be printed on the substrate. After exposure, the resist-coated wafer substrate is developed. The desired features as defined on the mask are then retained on the photoresist-coated substrate, while unexposed areas of resist are washed away. The wafer having the desired features defined is thereafter subjected to etching. Depending upon the production process, the etching may either be a wet etch in which liquid chemicals are used to remove wafer material or a dry etch in which wafer material is subjected to a radio frequency (RF) induced plasma. One particular concern relating to the etching process is maintaining control over the etching of the features, notably in the gate electrode region of the MOS transistor.

More specifically, one of the challenges encountered during the gate etch process of submicron technologies is the control of the etch profile. In many modern submicron processes, the gate electrode is comprised of a composite of layers of materials stacked on top of one another, and is thus commonly referred to as a "gate stack." In an exemplary process, a CMOS transistor may have a gate stack including a 1000 angstrom (Å) layer of tungsten (W), while a 500 Å of titanium nitride (TiN) provides a sheet resistance as low as 3 Ωf☐ (ohms per square), and a higher breakdown voltage for the gate oxide.

A commonly used gate stack is amorphous silicon (a-Si) or polysilicon (poly-Si) on top of a thin gate oxide. The a-Si or poly-Si is typically doped with N-type carriers for NMOS or with P-type carriers for PMOS to obtain asymmetry threshold voltage between N-channel and P-channel devices for a CMOS device. As the technologies evolve, the dimensions of integrated circuits shrink. In turn, as the IC dimensions get smaller, a thinner gate oxide is needed to maintain a level of gate capacitance for the performance of the IC devices. To avoid increasing the capacitance above the desired level, it is thus necessary to maintain a high conductivity in the a-Si or poly-Si to prevent the depletion of carriers in the gate region. This depletion of carriers tends to make the a-Si or poly-Si appear as an additional "oxide thickness" contributing series capacitance component that tends to lower the overall gate capacitance.

For an exemplary process having a 100 Å oxide layer, if the gate stack contributes 5 Å of "oxide thickness," the capacitance change would be about 5% (assuming other parameters are held constant). However, if a process has a 30 Å gate oxide layer, given a 5 Å change in thickness due to the oxide, the gate capacitance would change by about 20%. Therefore, the N-type and P-type doses required for the a-Si or poly-Si gate stack may be heavier. The thinning of the gate oxidation and the heavy doping of the a-Si and poly-Si with N-type or P-type carriers present a major challenge to the gate etch process.

Different doping types, doses, and activation level of the a-Si or poly-Si have a significant effect on the a-Si or poly-Si etch rate, as well as the etch profile. N-doped a-Si or poly-Si usually etches faster than P-doped a-Si or poly-Si in a plasma etch process. In adequately etching the P-type material, there is the possibility of etching the N-type material too much. In turn, any excessive etching may cause a localized breakthrough or "micro-trenching" of the thin gate oxidation in the bottom of the a-Si or poly-Si etch features.

In a typical a-Si or poly-Si gate plasma etching process, a main etch step with an optical endpoint is used to define the gate profile. The endpoint signal will trigger only when the a-Si or poly-Si begins clearing out of the wafer. At this point, there will be less N-doped a-Si remaining than P-doped Si. In addition, some N-doped a-Si may have been completely etched away. The etch process will break through the thin gate oxide and rapidly etch the underlying silicon substrate. After reaching the endpoint (or after the main-etch step) the process switches to a higher Si/SiO$_2$ selectivity over-etch step and completely removes all of the remaining a-Si (or poly-Si). The selectivity of the over-etch step is much more than that of the main-etch step. This assures a reasonable gate profile.

With a relatively thin gate oxide, micro-trenching is problematic, especially in N-doped areas. In a plasma etch process, gate etch profile is also very sensitive to the doping of a-Si or poly-Si. In addition, the doping profiles between N-doped and P-doped a-Si or poly-Si may be different. Accordingly, there is a need to maintain a good gate etch profile that is substantially free of micro-trenching and provides a consistent gate etch profile between N-type and P-type doped gate stacks, as well as good critical dimension control as the process technology approaches fractional microns in feature sizes.

SUMMARY OF INVENTION

The foregoing discussed drawbacks and deficiencies of the prior art are overcome or alleviated by a method for forming a semiconductor device, including forming a first locally doped semiconductor region of a first conductivity type and a second locally doped semiconductor region of a second conductivity type over an undoped, lower semiconductor region. A first etch is implemented to simultaneously create a desired pattern in the first and second locally doped semiconductor regions in a manner that also provides a first passivation of exposed sidewalls of the first and second locally doped semiconductor regions, wherein the first etch removes material from the first and second locally doped semiconductor regions at a substantially constant rate with respect to one another, and in a substantially anisotropic manner. A second etch is implemented to complete the desired pattern in the undoped, lower semiconductor region in a manner that protects the first and second locally doped semiconductor regions from additional material removal therefrom.

In another aspect, a method for forming a semiconductor device includes forming a locally doped N-type polysilicon region and a locally doped P-type polysilicon region over an undoped, lower polysilicon region. A first etch is implemented to simultaneously create a gate conductor pattern in the locally doped N-type and P-type polysilicon regions in a manner that also provides a first passivation of exposed sidewalls of the locally doped N-type and P-type polysilicon regions, wherein said first etch removes material from said locally doped N-type and P-type polysilicon regions at a substantially constant rate with respect to one another, and in a substantially anisotropic manner. A second etch is implemented to complete the gate conductor pattern in the undoped, lower polysilicon region in a manner that protects the locally doped N-type and P-type polysilicon regions from additional material removal therefrom.

BRIEF DESCRIPTION OF DRAWINGS

Referring to the exemplary drawings wherein like elements are numbered alike in the several Figures.

DETAILED DESCRIPTION

Disclosed herein is a method for a forming semiconductor device by uniformly and simultaneously etching complementary, pre-doped polysilicon regions of the device so as to produce substantially equivalent shaped N-type and P-type gate conductors. As is described in greater detail hereinafter, locally doped N-type and P-type polysilicon regions are provided with sidewall passivation so as to enable the use of an etch chemistry that etches the N-type and P-type polysilicon at substantially the same rate, but without isotropic etching effects that would otherwise erode the sidewalls of the N-type region. Remaining undoped lower portions of the polysilicon layer may then be etched away and the structure annealed to drive the dopants into the undoped portions of the resulting poly-gate structures.

Figure 1:
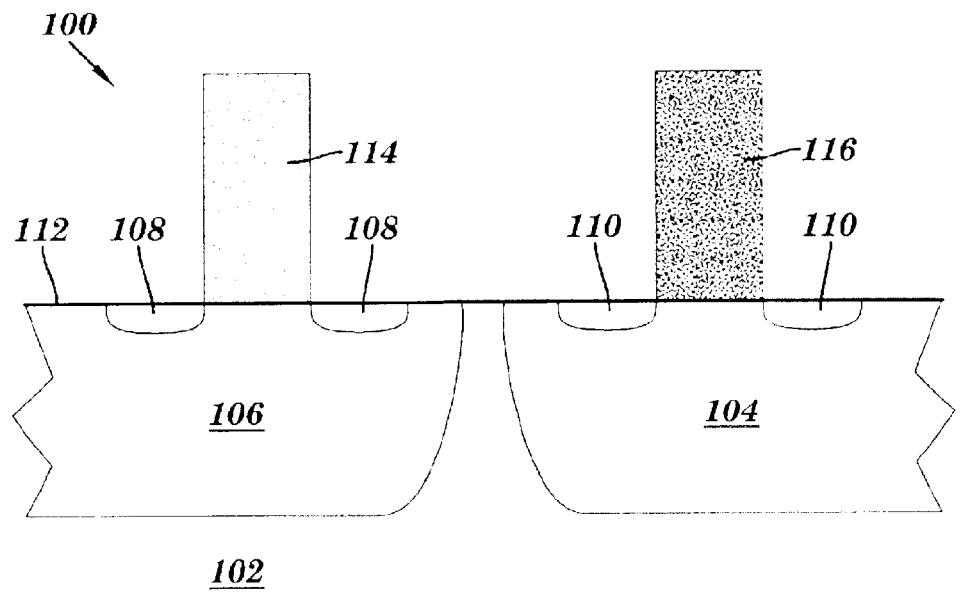
FIG. 1 illustrates a CMOS (complimentary metal oxide semiconductor) structure that may be fabricated in accordance with an embodiment of the invention.

Referring initially to FIG. 1, there is shown a CMOS (complimentary metal oxide semiconductor) structure 100 that includes a substrate 102, well regions 104, 106 (N and P type, respectively), source/drain regions 108, 110, a gate oxide layer 112, and a pair of gate conductors 114, 116 formed over the gate oxide 112. The gate conductors 114, 116 are formed from a gate conductor layer, which typically includes a semiconductor material such as polysilicon with different dopants (e.g., N-doped polysilicon and P-doped polysilicon).

Figure 2:
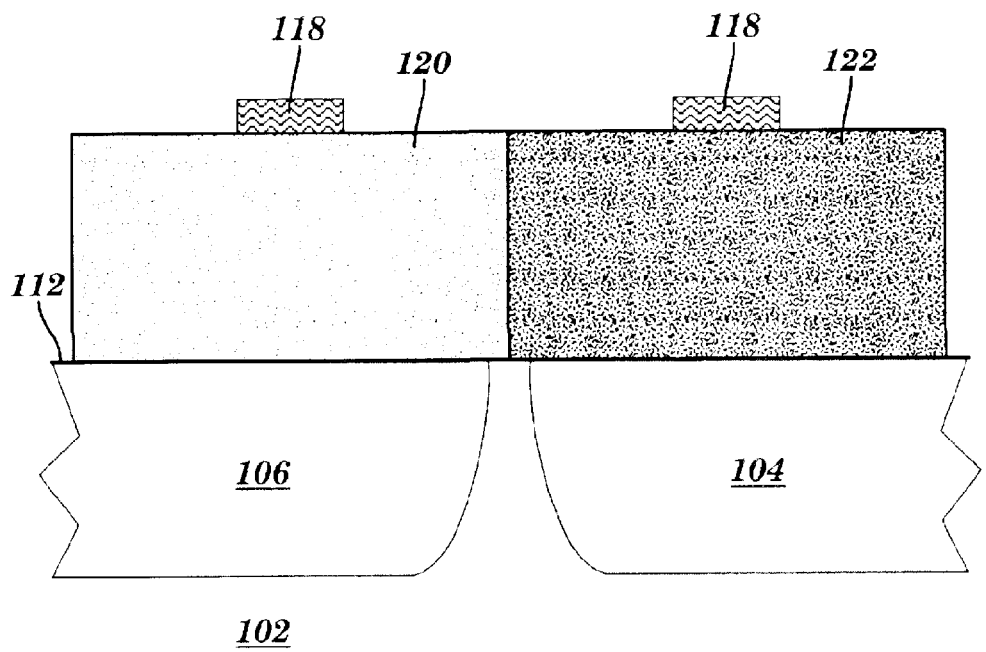
FIGS. 2 through 4 illustrate various processing steps in forming the CMOS structure of FIG. 1 in accordance with conventional processing techniques.

Conventionally, the structure 100 is formed as is shown in FIG. 2, wherein a patterned mask 118 (e.g., a hardmask of material such as TEOS, silicon nitride, CVD oxide, etc.) is used to pattern the doped regions 120, 122 of the gate conductor layer into gate conductors. A plasma etch process is used in conjunction with the mask 118 to remove portions of the doped regions 120, 122 of the gate conductor layer not protected by the mask 118. Prior to gate conductor patterning and etching, the conductor layer is first deposited with non-doped polysilicon. For an NMOS device, both the gate conductor 114 and source/drain regions 108 (FIG. 1) are both doped with N-type dopant (e.g., phosphorus) by ion implantation, while for a PMOS device, the gate conductor 116 and source/drain regions 110 are both doped with P-dopant (e.g., boron).

As indicated previously, in order to improve device performance, it has become necessary to dope the gate conductor and source/drain diffusions of a MOS device with different types of dopant. For example, the N-type gate conductor 114 may be doped with phosphorus first, and thereafter the source/drain diffusions 108 are doped with arsenic to form N-type devices after the formation of the gate conductors 114 and 116. In the case of P-type devices, it is preferable to first dope the P-type gate conductor with boron, and subsequently dope the source/drain diffusions 110 with boron difluoride ($BF_2$) after the formation of the gate conductors 114 and 116. Moreover, it is sometimes necessary to anneal the gate conductors at higher temperature than the source/drain regions. Accordingly, because of the different dopants used for the gate conductor and the source/drain region, the gate conductor layer is pre-doped with P-type dopant in one region and N-type dopant in the remaining regions before patterning and simultaneous etching thereof.

Figure 3:
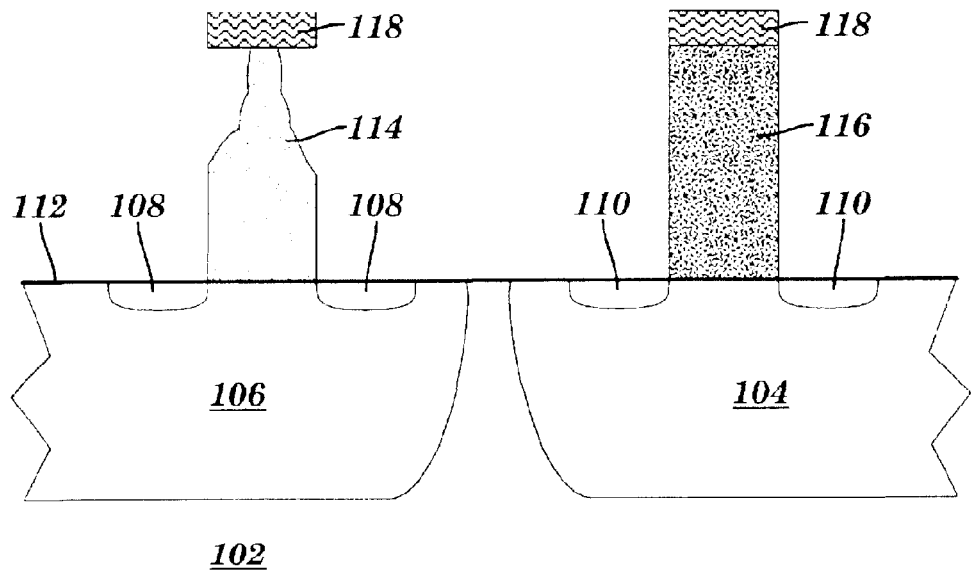
Figure 4:
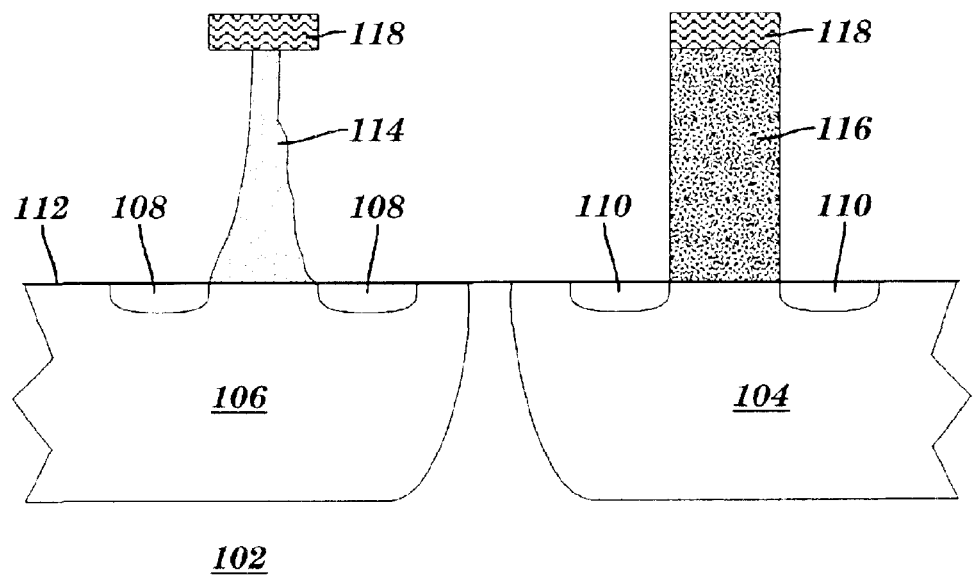

As also indicated previously, the difficulty in simultaneously patterning the gate structures containing both N-doped and P-doped poly resides in the plasma etching thereof at similar rates and profiles. In general, N-doped poly etches faster and tends to be more isotropic than P-doped poly in plasma etching. This is illustrated in FIG. 3, where, in the un-annealed samples depicted, the N-type gate conductor 114 is shown to have excessive lateral etching in the implanted region as compared to P-type gate conductor 116. FIG. 4 illustrates even more pronounced lateral etching in the N-type gate conductor sidewall resulting from an annealed sample. In either case, there is a strong loss of dopant in N-type poly conductor. In addition, the gate oxide 112 around the N-type poly is exposed to plasma for a longer duration than the P-type poly region since the N-type poly etches faster than the P-type poly. As a result, the thin gate oxide around the N-type poly region can easily be ruptured and is prone to punchthrough. Furthermore, the etched profile of the N-type poly is different from that of the P-type poly (as shown in FIGS. 3 and 4), resulting in different critical dimensions (CD).

Therefore, in accordance with an embodiment of the invention, there is disclosed a method uniformly etching dual, pre-doped polysilicon regions of a semiconductor device. Briefly stated, the present method addresses the above described concerns through a processing sequence that implants a first selected region of polysilicon with an N-type dopant, and a second selected region of the polysilicon with a P-type dopant to form locally doped regions. A hardmask is deposited and photolithographically exposed with photoresist. Then, the hard mask is etched, along with the first and second selected polysilicon regions (i.e., the locally doped regions) using the photoresist material. After this process, the photoresist material is stripped by the oxygen plasma and a passivation layer is formed on the sidewalls of the etched, implanted locally doped regions. Next, a less aggressive plasma etching is applied to remove the remaining polysilicon layer. The passivation layer prevents the N-doped region of the gate conductor from suffering sidewall etching in the less aggressive plasma etching. Thereafter, conventional processing may be continued such as, for example, annealing, doping of the source/drain regions, etc.

The present method is advantageous in that it is easier to control the profiles of the implanted layers in the presence of photoresist. In general, fluorine-type plasma etches P-type and N-type polysilicon at a similar rate, whereas N-type polysilicon is etched faster rate than P-type polysilicon in a chlorine or bromine-type plasma. On the other hand, a fluorine-type plasma tends to etch polysilicon isotropically. However, by etching in the presence of photoresist, the carbon-containing species released therefrom renders the process an anisotropic one to an extent, since the photoresist helps to passivate the initially etched sidewalls. Furthermore, the photoresist also serves to protect the hardmask.

After the locally doped regions of the polysilicon layer are etched, the photoresist used to form a passivation layer on the vertical surfaces of the partially formed gate structures of the N-doped and P-doped devices is removed. Thereafter, a less aggressive plasma etch may be used to remove the remaining undoped polysilicon layer to complete definition of the gate structure. In particular, an oxide sidewall passivation layer formed by plasma stripping of the photoresist prevents the N-doped region of the gate conductor from suffering excessive sidewall etching that is seen in conventional processing. FIGS. 5–10 illustrate in greater detail an embodiment of the present method, which utilizes this sidewall passivation.

Figure 5:
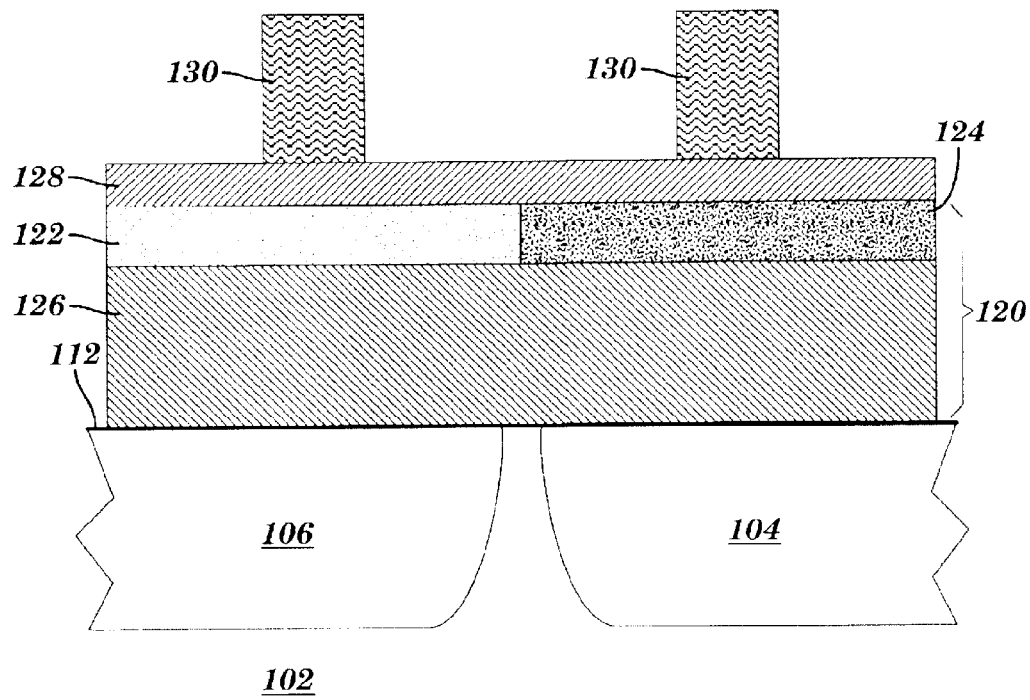
FIGS. 5–10 illustrate a method for uniformly etching dual, pre-doped polysilicon regions of a semiconductor device, in accordance with an embodiment of the invention.

Referring to FIG. 5, there is shown a processing stage of a CMOS structure formed upon a substrate 102, including N-type well region 104, P-type well region 106, and gate oxide layer 112 formed thereupon. For ease of illustration, like elements of earlier figures are designated with the same reference numerals. An initially formed polysilicon layer 120 includes a locally doped N-type region 122 and a locally doped P-type region 124 atop the remainder of the undoped polysilicon 126, as explained earlier. In the example illustrated, the N-type region 122 includes one or more N-type impurities implanted therein, while the P-type region 124 includes one or more P-type impurities implanted therein. However, the P-type region 124 could also simply comprise an undoped region as well. During subsequent annealing processes, any impurities contained within the locally doped regions 122, 124 will migrate throughout the lower undoped polysilicon region 126. The locally doped regions 122, 124 may be formed by using well-defined ion energy during the ion implant.

It is preferable to delay the annealing process until after the gate conductors are formed so as to reduce the excessive erosion of the N-type gate conductor during the plasma process. Again, this uneven reaction is due to the fact that the N-type conductor reacts faster than the P-type conductor in conventional plasma processes. Accordingly, in addition to utilizing a vertical passivation layer to protect the sidewalls of the N-type gate conductor, the present method embodiment also delays the annealing process until the gate conductor structures are defined.

Figure 6:
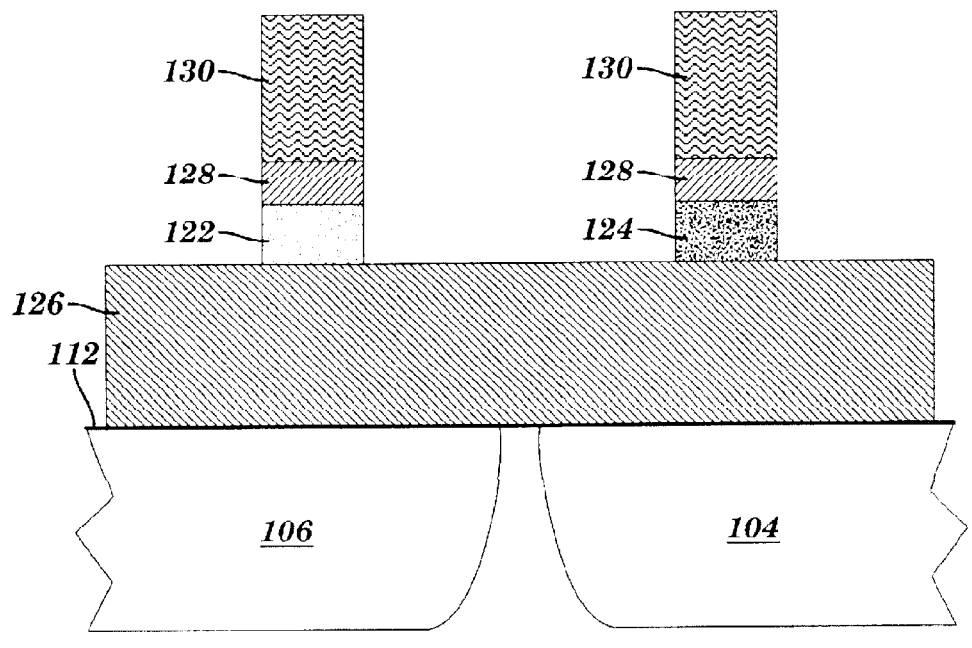

FIG. 5 also illustrates a hardmask layer 128 (e.g., TEOS, silicon nitride, CVD oxide) formed over the locally doped regions 122, 124. A patterned photoresist/antireflective coating (ARC) layer 130 is also shown formed over the hardmask layer 128. As will be noted, the patterned photoresist/ARC layer 130 is used to define the gate conductor structures. Then, as shown in FIG. 6, plasma etch is utilized to etch away the exposed portions of the hardmask layer 128 with a first type of etchant. A second type of etchant is subsequently to etch away exposed portions of the locally doped regions 122, 124. Again, the plasma parameters used to etch the locally doped regions 122, 124 are selected such that there will be relatively little difference in etch rates and profiles between N-type doped region 122 and the P-type doped region 124. After the photoresist is removed, the etching process is continued such that a portion of the undoped region 126 is also removed.

A plasma etching step may be adjusted by changing a variety of properties, such as the etch rate, selectivity between different materials, and anisotropic versus isotropic nature of the etch. It is further possible to manipulate a plasma etching step to yield certain properties, by selecting a particular chemistry through choosing a combination of gases, flow rates, pressure, powers, and temperatures of the various component surfaces in contact with the plasma and semiconductor substrate. A plasma step can etch a material both laterally and vertically. Thus, depending on the particular process condition, relative etch rates along these two directions may be different and manipulated.

In the present embodiment, a fluorine-containing plasma is utilized to etch the locally doped polysilicon regions 122, 124, as it provides similar etch rates between N-type and P-type polysilicon. However, etching for both types of polysilicon in fluorine-based plasma tends to be isotropic, particularly for N-type polysilicon. One way to attain anisotropic polysilicon etching with fluorine-based plasma is to passivate the etched sidewalls with a polymer substance by using fluorocarbon chemistry, such as $CF_4$, $CHF_3$, $C_4F_8$, or $C_2F_6$, for example. As a fluorocarbon plasma also etches oxide at a fast rate, it is preferable to use photoresist as a mask material. In addition, erosion of the photoresist in fluorine-based plasma releases fluorocarbon that helps the passivation mechanism. It has been found that an $NF_3$/Ar etch chemistry works well in an AME-5000 reactor, as does $CF_4$/$SF_6$ or $CF_4$/$NF_3$ in a LAM-2300 and TEL-SCCM reactor.

Figure 7:
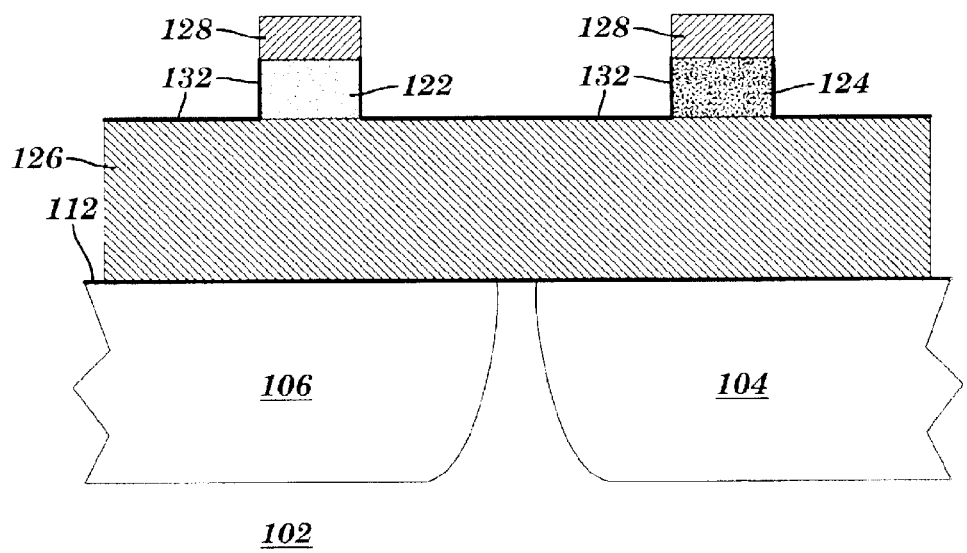
Figure 8:
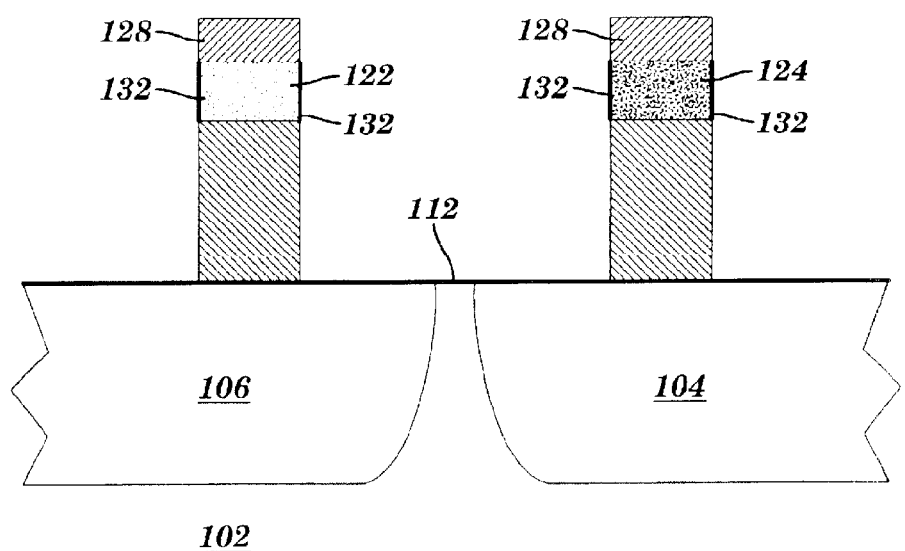

Referring now to FIG. 7, an oxygen plasma is utilized to strip away the photoresist and also remove the sidewall polymer material formed on the etched, doped-polysilicon regions 122, 124. At the same time, the oxygen plasma forms a passivation layer (i.e., a silicon oxide-like material) 132 on the exposed surfaces (vertical and horizontal) of the doped and undoped regions of the polysilicon. Subsequently, another etching process first removes the passivation layer 132 from the horizontal surfaces of the undoped polysilicon lower region 126, followed by an anisotropic etching of the remaining portions of the undoped lower region 126 not protected by the hardmask 126 to define the shape of N-type and P-type conductors, as shown in FIG. 8. The remaining vertical passivation layer 132 prevents this latest etching process from affecting the shape of the doped regions 122, 124. In particular, this etching process may be any known plasma process that etches undoped polysilicon, wherein there is also a native oxide layer present on the polysilicon surface. As a result, the N-type gate conductor will have substantially the same profile (i.e., shape and size) as the P-type gate conductor.

Figure 9:
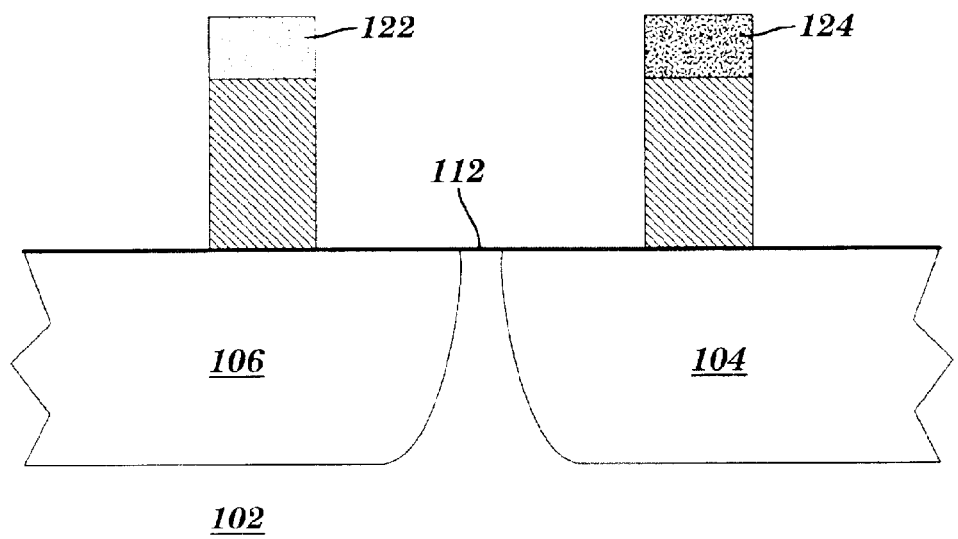
Figure 10:
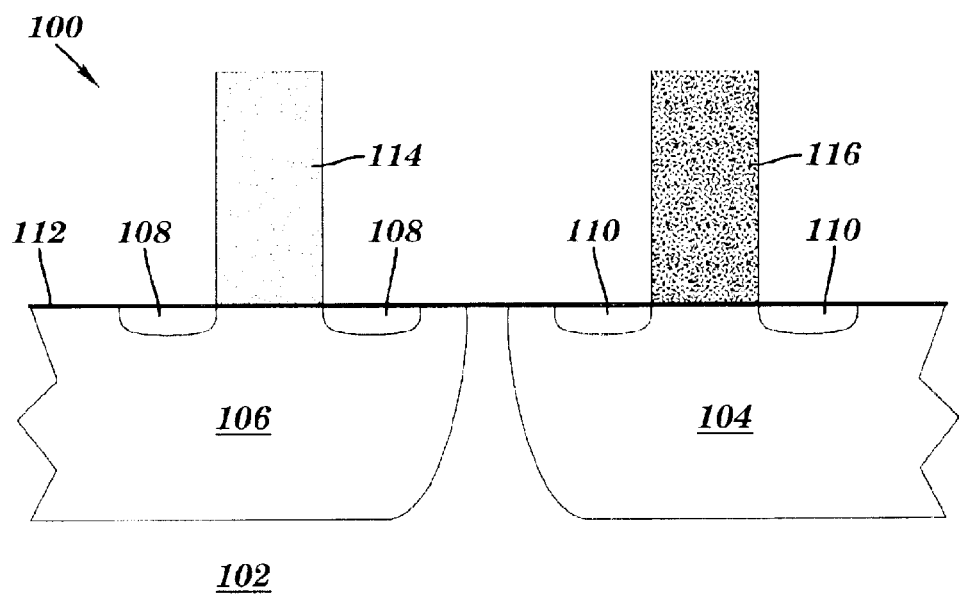

Upon completion of the undoped polysilicon etching, the vertical passivation layer 132 may be removed after cleaning the wafer in a diluted HF-solution (e.g., 200:1 DHF) that also removes the oxide hardmask 128, as shown in FIG. 9. Finally, after the DHF clean, annealing is performed to allow the dopants to diffuse into the previously undoped regions 126 of the polysilicon so as to define the N-type gate conductor 114 and the P-type gate conductor 116 as illustrated in FIG. 10. In addition, the source/drain regions 108, 110 are doped (as also shown in FIG. 10), and the remaining device fabrication steps may be continued in accordance with conventional processing techniques.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming a semiconductor device, the method comprising:

forming a first locally doped semiconductor region of a first conductivity type and a second locally doped semiconductor region of a second conductivity type over an undoped, lower semiconductor region;

implementing a first etch to simultaneously create a desired pattern in said first and second locally doped semiconductor regions in a manner that also provides a first passivation of exposed sidewalls of said first and second locally doped semiconductor regions, wherein said first etch removes material from said first and second locally doped semiconductor regions at a substantially constant rate with respect to one another, and in a substantially anisotropic manner; and implementing a second etch to complete said desired pattern in said undoped, lower semiconductor region in a manner that protects said first and second locally doped semiconductor regions from additional material removal therefrom.

2. The method of claim 1, further comprising annealing the device so as to diffuse dopant from said first and second locally doped semiconductor regions into respective patterned lower semiconductor regions thereof.

3. The method of claim 1, wherein said first etch is implemented using a patterned hardmask layer and a patterned photoresist layer over said first and second locally doped semiconductor regions.

4. The method of claim 3, wherein said first etch is implemented using a fluorine based plasma chemistry.

5. The method of claim 4, wherein said photoresist layer includes a carbon containing species.

6. The method of claim 5, wherein said first passivation includes a fluorocarbon based polymer.

7. The method of claim 4, wherein said first etch comprises at least one of an $NF_3/Ar$, a $CF_4/SF_6$ and a $CF_4/NF_3$ etch chemistry.

8. The method of claim 3, further comprising removing said patterned photoresist layer and said first passivation following said first etch, wherein the removal of said photoresist layer and said first passivation further results in the formation of a second passivation of exposed sidewalls of said first and second locally doped semiconductor regions.

9. The method of claim 8, wherein said second passivation protects said first and second locally doped semiconductor regions from additional material removal therefrom during said second etch.

10. The method of claim 9, wherein said patterned photoresist layer and said first passivation are removed with an oxygen based plasma, and wherein said second passivation further comprises an oxide layer.

11. A method for forming a semiconductor device, the method comprising:

forming a locally doped N-type polysilicon region and a locally doped P-type polysilicon region over an undoped, lower polysilicon region;

implementing a first etch to simultaneously create a gate conductor pattern in said locally doped N-type and P-type polysilicon regions in a manner that also provides a first passivation of exposed sidewalls of said locally doped N-type and P-type polysilicon regions, wherein said first etch removes material from said locally doped N-type and P-type polysilicon regions at a substantially constant rate with respect to one another, and in a substantially anisotropic manner; and implementing a second etch to complete said gate conductor pattern in said undoped, lower polysilicon region in a manner that protects said locally doped N-type and P-type polysilicon regions from additional material removal therefrom.

12. The method of claim 11, further comprising annealing the device so as to diffuse dopant from said locally doped N-type and P-type semiconductor regions into respective patterned lower polysilicon regions thereof.

13. The method of claim 11, wherein said first etch is implemented using a patterned hardmask layer and a patterned photoresist layer over said locally doped N-type and P-type polysilicon regions.

14. The method of claim 13, wherein said first etch is implemented using a fluorine based plasma chemistry.

15. The method of claim 14, wherein said photoresist layer includes a carbon containing species.

16. The method of claim 15, wherein said first passivation includes a fluorocarbon based polymer.

17. The method of claim 14, wherein said first etch comprises at least one of an $NF_3/Ar$, a $CF_4/SF_6$ and a $CF_4/NF_3$ etch chemistry.

18. The method of claim 13, further comprising removing said patterned photoresist layer and said first passivation following said first etch, wherein the removal of said photoresist layer and said first passivation further results in the formation of a second passivation of exposed sidewalls of said locally doped N-type and P-type polysilicon regions.

19. The method of claim 18, wherein said second passivation protects said locally doped N-type and P-type polysilicon regions from additional material removal therefrom during said second etch.

20. The method of claim 19, wherein said patterned photoresist layer and said first passivation are removed with an oxygen based plasma, and wherein said second passivation further comprises an oxide layer.

* * * * *